United States Patent
Park

(10) Patent No.: US 8,320,171 B2
(45) Date of Patent: Nov. 27, 2012

(54) PHASE CHANGE MEMORY DEVICES AND MEMORY SYSTEMS INCLUDING THE SAME

(75) Inventor: Mu-Hui Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 325 days.

(21) Appl. No.: 12/662,180

(22) Filed: Apr. 5, 2010

(65) Prior Publication Data

US 2010/0271868 A1 Oct. 28, 2010

(30) Foreign Application Priority Data

Apr. 23, 2009 (KR) .................. 10-2009-0035286

(51) Int. Cl.
*G11C 11/00* (2006.01)

(52) U.S. Cl. ............. 365/163; 365/189.06; 365/189.09

(58) Field of Classification Search .............. 365/148, 365/163, 189.06, 189.07, 189.09, 189.15
See application file for complete search history.

(56) References Cited

U.S. PATENT DOCUMENTS

| | | | | |
|---|---|---|---|---|
| 7,663,100 B2 * | 2/2010 | Vestal | ................. | 250/287 |
| 7,663,910 B2 * | 2/2010 | Kang et al. | ................. | 365/163 |
| 7,692,979 B2 * | 4/2010 | Fuji et al. | ................. | 365/189.15 |
| 7,813,167 B2 * | 10/2010 | Porter | ................. | 365/163 |
| 2006/0221678 A1 * | 10/2006 | Bedeschi et al. | ................. | 365/163 |
| 2008/0291715 A1 * | 11/2008 | Park et al. | ................. | 365/148 |

FOREIGN PATENT DOCUMENTS

| | | |
|---|---|---|
| JP | 01-278116 | 11/1989 |
| KR | 10-0434432 | 5/2004 |
| KR | 10-0809334 | 2/2008 |

* cited by examiner

*Primary Examiner* — Gene Auduong

(74) *Attorney, Agent, or Firm* — Harness, Dickey & Pierce, P.L.C.

(57) ABSTRACT

A phase change memory device includes a memory cell array having a plurality of phase change memory cells, a read bias generating circuit, a clamping circuit and a clamping control signal generating circuit (CCSGC). The read bias generating circuit provides a sensing node with a read bias for reading a resistance level of a selected phase change memory cell. The clamping circuit controls an amount of clamping current flowing into a bit line connected with the selected phase change memory cell. The CCSGC provides the clamping control signal to the clamping circuit and adjusts a level of the clamping control signal.

15 Claims, 8 Drawing Sheets

PHASE CHANGE MEMORY DEVICES AND MEMORY SYSTEMS INCLUDING THE SAME

CROSS-REFERENCE TO RELATED APPLICATIONS

This application claims priority under 35 USC §119 to Korean Patent Application No. 2009-0035286, filed on Apr. 23, 2009, in the Korean Intellectual Property Office (KIPO), the entire contents of which are herein incorporated by reference.

BACKGROUND

1. Technical Field

Example embodiments relate to memory devices, and more particularly to phase change memory devices and memory systems including the same.

2. Description of the Related Art

Nonvolatile memory devices using resistance materials include a resistive random access memory (RRAM), a phase change random access memory (PRAM), and a magnetic random access memory (MRAM). Dynamic random access memory (DRAM) and flash memory devices store data using charges. Nonvolatile memory devices using resistance materials store data using the resistance of variable resistive elements (e.g., RRAM), phase change of phase change material such as chalcogenide alloy (e.g., PRAM), and resistance change of magnetic tunnel junction (MJT) thin films according to the magnetization state of a ferromagnetice substance.

Using phase change memory cells as an example, the phase change material changes into a crystalline state or an amorphous state by cooling after heating. Since the phase change material in the crystalline state has a low resistance and the phase change material in the amorphous state has a high resistance, the crystalline state may be defined as set data (0), and the amorphous state may be defined as reset data (1).

Sensing margin is very important for securing credibility of read operation of the phase change memory device because the sensing margin is a criterion for discriminating a difference of resistance distributions of the set data and the reset data which are determined after write operation is performed. When the sensing margin narrows due to various factors, such as temperature, processes associated with manufacturing the phase change memory device and operating power supply voltage provided to the phase change memory device, the set state and the reset state may not be correctly distinguished. Then, the credibility of operations of the phase change memory device is degraded and yield of the phase change memory device may be reduced.

SUMMARY

Some example embodiments provide a phase change memory device, capable of compensating for change of sensing margin.

Some example embodiments provide a memory system including the phase change memory device.

According to example embodiments, a phase change memory device includes a memory cell array having a plurality of phase change memory cells, a read bias generating circuit, a clamping circuit and a clamping control signal generating circuit (CCSGC). The read bias generating circuit outputs a read bias current. The clamping circuit controls an amount of clamping current into a bit line connected with a selected phase change memory cell, in response to a clamping control signal. The CCSGC generates the clamping control signal based on the read bias current.

The CCSGC is configured to adjust the clamping control signal based on the read bias current and at least one of a change of ambient temperature of the phase change memory device, a process variation in fabrication of the phase change memory device and a change of an operation voltage.

The CCSGC may include a self tracking circuit and a level shifter. The self tracking circuit is configured to receive an operation voltage and generate an intermediate clamping control signal based on a voltage of a sensing node, the sensing node receiving the read bias current. The level shifter shifts the intermediate clamping control signal to output the clamping control signal.

The self tracking circuit may include first and second p-type metal oxide semiconductor (PMOS) transistors configured to receive a bias voltage, the first PMOS transistor being configured to receive the operation voltage, and the second PMOS transistor being connected in series to the first PMOS transistor; first and second resistors, the first resistor being connected to the second PMOS transistor, and the second resistor being connected in series to the first resistor; first and second n-type MOS (NMOS) transistors, the first NMOS transistor being connected to the second resistor, and the second NMOS transistor being connected in series to the first NMOS transistor; and a bias voltage providing unit configured to output the bias voltage.

The third and fourth resistors are connected at a first node, the bias voltage providing unit includes third and fourth resistors connected in series between a power supply voltage and a ground voltage, and the bias voltage is output at the first node.

The first and second PMOS transistors are in configured to be in a conducting state in response to the bias voltage.

The first and second resistors are connected at a second node, the intermediate clamping control signal is output at the second node, and each of the first and second NMOS transistors is diode-connected.

The level shifter may include an operational amplifier having a first input terminal configured to receive the intermediate clamping control signal; a third PMOS transistor having a source configured to receive the operation voltage, a gate connected to an output terminal of the operational amplifier, and a drain, the clamping control signal being output at the drain; and a level adjusting unit connected to the drain of the third PMOS transistor at a third node, the level adjusting unit being configured to adjust the clamping control signal.

The level adjusting unit may include a fifth resistor connected to the third node; and a sixth resistor connected in series to the fifth resistor at a fourth node. The fourth node is connected to a second input terminal of the operational amplifier.

The clamping control signal and the intermediate clamping control signal have a relationship as follows:

$$VCMP=(1+R5/R6)\times VCMPI,$$

where, VCMP is the clamping control signal, VCMPI is the intermediate clamping control signal, R5 is the fifth resistor, and R6 is the sixth resistor.

The CCSGC is configured to adjust the clamping control signal based on the read bias current and the operation voltage.

The CCSGC is configured to adjust the clamping control signal based on the read bias current and a level that is inversely proportional to a change of ambient temperature.

The CCSGC is configured to adjust the clamping control signal based on the read bias current and a level that is inversely proportional to a change of a threshold voltage of an NMOS transistor included in the CCSGC.

The CCSGC is configured to adjust the clamping control signal based on the read bias current and a level that is proportional to a change of a threshold voltage of a PMOS transistor included in the CCSGC.

According to example embodiments, a memory system includes a phase change memory device having a plurality of phase change memory cells configured to store data and a memory controller configured to control the phase change memory device. The phase change memory device includes a read bias generating circuit, a clamping circuit and a clamping control signal generating circuit (CCSGC). The read bias generating circuit outputs a read bias current The clamping circuit controls an amount of clamping current into a bit line connected with a selected phase change memory cell, in response to a clamping control signal. The CCSGC generates the clamping control signal based on the read bias current.

The CCSGC is configured to adjust the clamping control signal based on the read bias current and at least one of a change of ambient temperature of the phase change memory device, a process variation in fabrication of the phase change memory device and a change of an operation voltage.

The CCSGC is configured to adjust the clamping control signal based on the read bias current and a one of (1) the operation voltage, (2) a level that is inversely proportional to the change of ambient temperature, (3) a level that is inversely proportional to a change of a threshold voltage of a NMOS transistor, or (3) a level that is proportional to a change of a threshold voltage of a PMOS transistor, wherein the NMOS and PMOS transistors are included in the CCSGC.

Accordingly, the phase change memory device according to example embodiments is capable of compensating for change of sensing margin such that credibility of read operation of the phase change memory device is secured.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF EXAMPLE EMBODIMENTS

Figure 1:
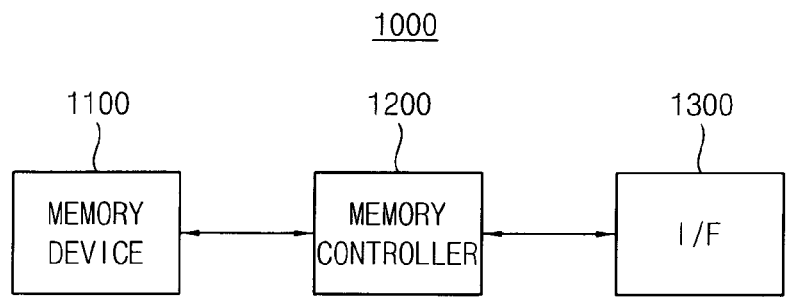
FIG. 1 illustrates a memory system according to example embodiments.

Various example embodiments will be described more fully hereinafter with reference to the accompanying drawings, in which some example embodiments are shown. Inventive concepts may, however, be embodied in many different forms and should not be construed as limited to the example embodiments set forth herein. Rather, example embodiments are provided so that this disclosure will be thorough and complete, and will fully convey the scope of inventive concepts to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the inventive concepts. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a memory system according to example embodiments.

Referring to FIG. 1, a memory system 1000 includes a phase change memory device 1100 and a memory controller 1200. The memory system 1000 may further include an interface 1300 for communicating with an external device or users.

The phase change memory device 1100 includes a plurality of phase change memory cells for storing data. The memory controller 1200 controls overall input/output operations of the phase change memory device 1100.

Figure 2:
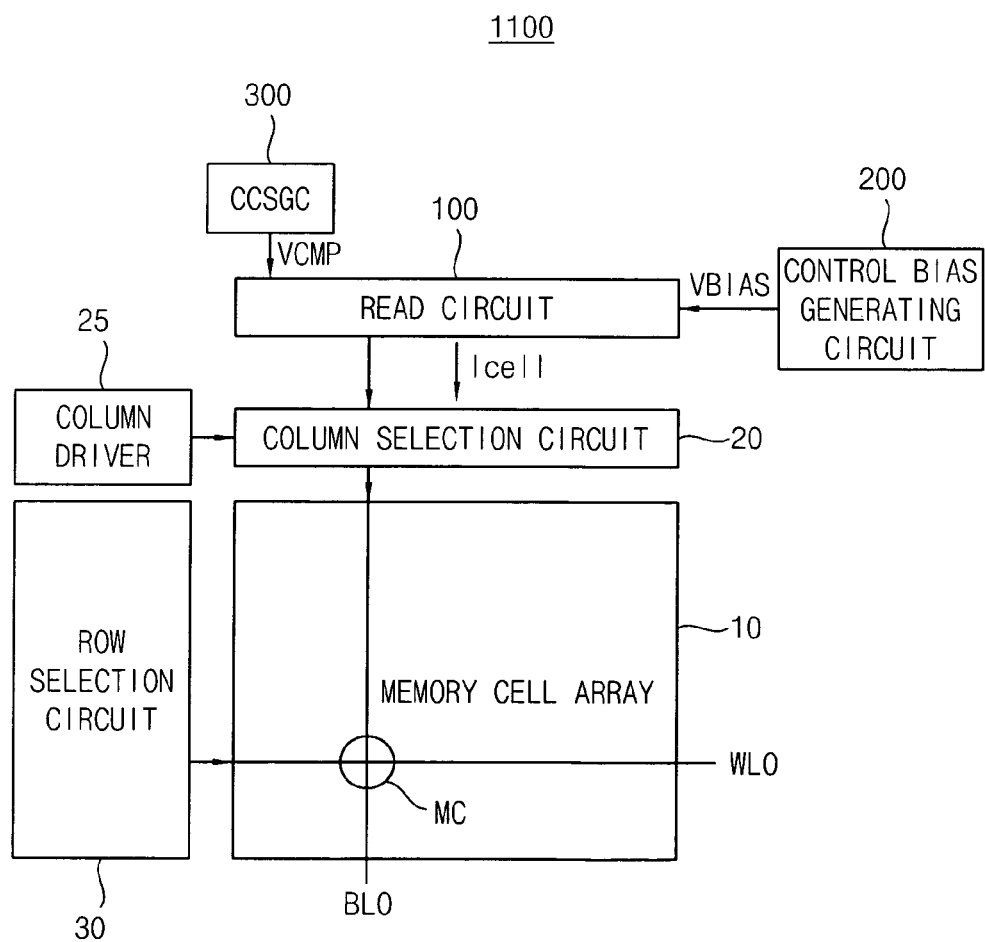
FIG. 2 illustrates a phase change memory device according to example embodiments.
Figure 3:
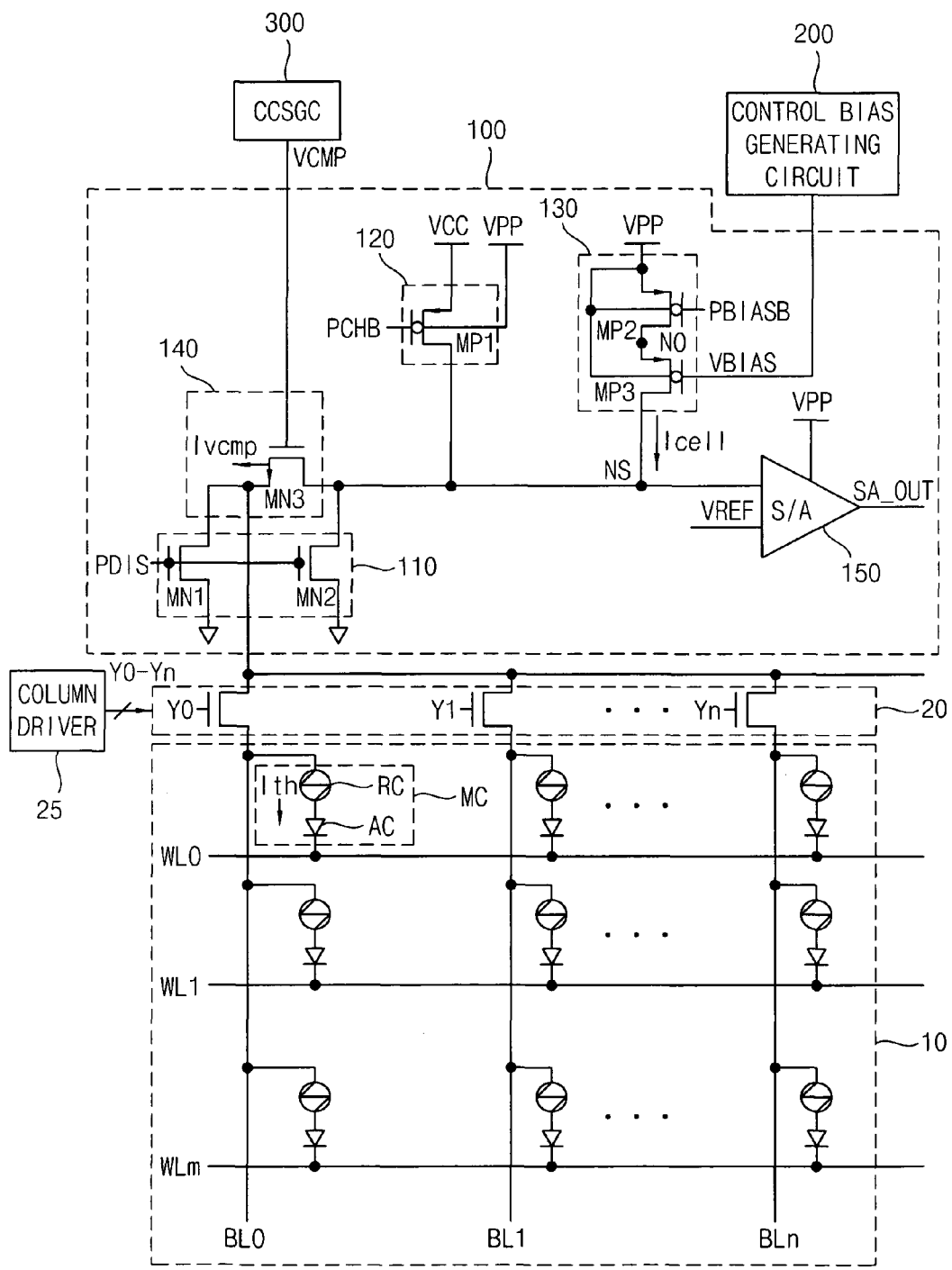
FIG. 3 is a diagram illustrating the blocks illustrated in FIG. 2 according to example embodiments.

FIG. 2 is a block diagram illustrating a phase change memory device according to example embodiments. FIG. 3 is a diagram illustrating the blocks illustrated in FIG. 2 according to example embodiments, although a row selection circuit is not illustrated in FIG. 3 for the sake of explanatory convenience.

Referring to FIGS. 2 and 3, the phase change memory device 1100 includes a memory cell array 10, a column selection circuit 20, a column driver 25, a row selection circuit 30, a read circuit 100, a control bias generating circuit 200 and a clamping control signal generating circuit (CCSGC) 300. The column driver 25 outputs selection signals Y0-Yn associated with a selected phase change memory cell MC to the column selection circuit 20.

The memory cell array 10 includes a plurality of phase change memory cells MC arranged in a matrix shape. Each phase change memory cell MC may be connected between each of word lines WL0~WLm and each of bit lines BL0~BLn. In addition, each phase change memory cell MC may include a variable resistive element RC that includes a phase change material having two different resistances according to a crystalline state and an amorphous state, and an access element AC that controls current flow in the variable resistive element RC. The access element AC may be a diode or a transistor connected to the variable resistive element RC in series. A diode is illustrated as the variable resistive element RC in FIG. 3. In addition, the phase change material may use various materials, two atomic compounds, such as GaSb, InSb, InSe, $Sb_2Te_3$, or GeTe, three atomic compounds, such as, GeSbTe, GaSbTe, InSbTe, $SnSb_2Te_4$, or INSbGe, or four atomic compounds, such as AgInSbTe, (GeSn)SbTe, GeSb(SeTe) or $Te_{81}Ge_{15}Sb_2S_2$. GeSbTe consisting of germanium (Ge), antimony (Sb), and tellurium (Te), is used in particular.

The column selection circuit 20 selects a subset of the bit lines (e.g., BL0) from the plurality of bit lines BL0~BLn, and the row selection circuit 30 selects a subset of word lines (e.g., WL0) from among the word lines WL0~WLm.

The read circuit 100 reads data stored in the phase change memory cell MC selected in the memory cell array 10. More particularly, the read circuit reads a resistance level of the phase change memory cell MC by supplying the phase change memory cell MC selected by a control bias signal VBIAS with a read bias current Icell.

The read circuit 100, as illustrated in FIG. 3, includes a discharge circuit 110, a precharge circuit 120, a read bias generating circuit 130, a clamping circuit 140 and a sense amplifier 150.

The discharge circuit 110 discharges a bit line (e.g., BL0) connected with the selected phase change memory cell MC before the read operation and/or sensing node NS to a voltage, for example, ground voltage VSS. The discharge circuit 110 may include a n-type metal oxide semiconductor (NMOS) transistor MN1, which is connected between the bit line BL0 and the ground voltage VSS and receives a discharge signal PDIS through a gate, and a NMOS transistor MN2, which is connected between the sensing node NS and the ground voltage VSS and receives the discharge signal PDIS through a gate.

The precharge circuit 120 precharges the sensing node NS to a level, for example, a power supply voltage VCC during the precharge period in a data read operation. The precharge circuit 120 may include a p-type MOS (PMOS) transistor MP1, which is connected between the power supply voltage VCC and the sensing node NS and receives a precharge signal PCHB through a gate.

The read bias generating circuit 130 responds to the control bias VBIAS and provides the sensing node NS with the read bias current Icell for reading the resistance level of the selected phase change memory cell MC. When the data stored in the phase change memory cell MC is set data, the amount of current which flows through the phase change memory cell MC is large because the resistance of the phase change material is small. When the data stored in the phase change memory cell MC is reset data, the amount of current which flows through the phase change memory cell MC is small because the resistance of the phase change material is large.

The amount of read bias current Icell provided by the read bias generating circuit 130 may be an amount that compensates for a pass through current Ith in a reset state. When the read bias current Icell compensates for the current flowing in a reset state, the level of the sensing node NS may be maintained at a certain level or slightly raised when the reset data is stored. When the set data is stored, the level of the sensing node NS is lowered. Therefore, the set data may be easily distinguished from the reset data because the difference between the level of the sensing node NS of the reset data and the level of the sensing node NS of the set data may be large. As a result, the sensing margin may be increased. The read bias generating circuit 130 includes a PMOS transistor MP2, which is connected between operation voltage VPP and a node N0 and receives a selection signal PBIASB through a gate, and a PMOS transistor MP3, which is connected between the node N0 and the sensing node NS and receives the control bias VBIAS through a gate. Each of substrate regions where the PMOS transistors MP2 and MP3 are formed may be connected to the operation voltage VPP.

The clamping circuit 140 clamps the level of the bit line BL0 to a certain bias level, for example, within a proper range to read. More particularly, the clamping circuit 140 clamps the level of the bit line BL0 to a level below a threshold voltage Vth of the phase change materials. This is because the phase of the phase change material of selected phase change memory cell MC may change when the clamp level is above the critical threshold voltage Vth. The clamping circuit 140 may include a NMOS transistor MN3, which is connected between the bit line BL0 and the sensing node NS and receives a clamping control signal VCMP through a gate. The clamping control signal VCMP may be a regulated voltage signal, for example, but is not limited thereto.

The sense amplifier 150 provides a comparison output SA_OUT by comparing the level of the sensing node NS and a reference level VREF. For example, when the level of the sensing node NS is higher than the reference level VREF, the sense amplifier 150 generates a high level of the comparison output SA_OUT. On the contrary, when the level of the sensing node NS is lower than the reference level VREF, the sense amplifier 150 generates a low level of the comparison output SA_OUT. When the comparison output SA_OUT is at the high level, the phase change memory cell MC stores the set data, and when the comparison output SA_OUT is at the low level, the phase change memory cell MC stores the reset data. The sense amplifier 150 may be a current sense amplifier, for example, which senses a current change that flows through the bit line BL0 of the selected phase change memory cell MC against a reference current. Alternatively, the sense amplifier 150 may be a voltage sense amplifier, for example, which senses a voltage change against a reference voltage. FIG. 3 illustrates the sense amplifier 150 as a voltage sense amplifier, as an example embodiment.

The level of the sensing node NS, which serves as a reference for discriminating the state of the memory cell of the phase change memory device in case of read operation, may change according to a plurality factors, which is associated with the phase change memory device, such as temperature change of the phase change memory device, threshold voltage differences of the MOS transistors, included in the phase change memory device, due to process variation and level change of the operation voltage provided to the phase change memory device.

Figure 4:
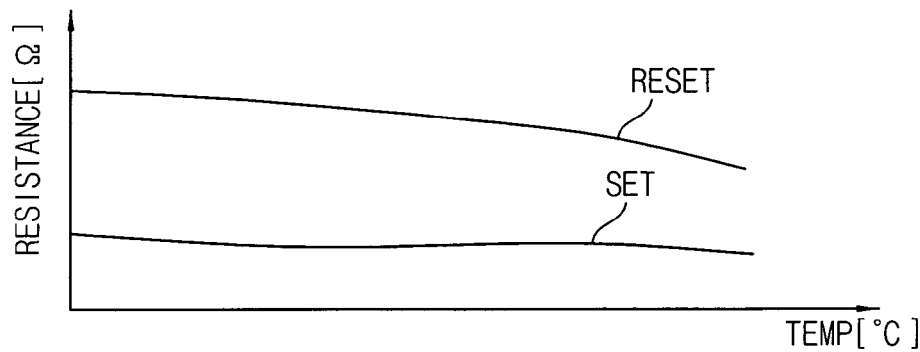
FIG. 4 illustrates a correlation of a phase change material and resistance according to temperature change.

FIG. 4 illustrates a correlation of a phase change material and resistance according to temperature change.

Figure 5:
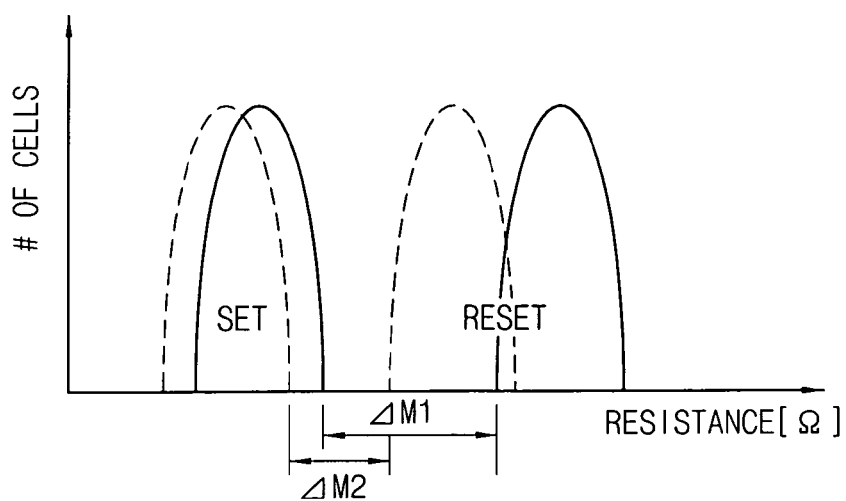
FIG. 5 illustrates set and reset resistance distributions of a phase change memory cell depending on temperature change.

FIG. 5 illustrates set and reset resistance distributions of a phase change memory cell depending on temperature change.

Figure 6:
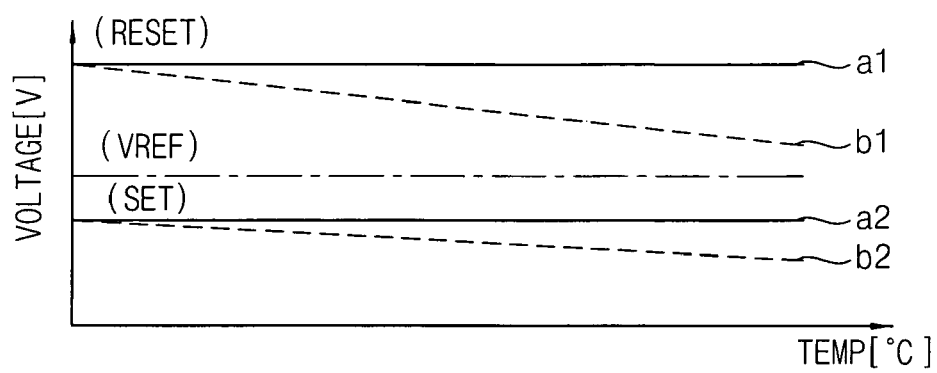
FIG. 6 illustrates a level change of a sensing node depending on temperature change.

FIG. 6 illustrates a level change of a sensing node depending on temperature change.

As temperature rises, the set resistance and the reset resistance of the phase change material may decrease, as illustrated in FIG. 4. In addition, as illustrated in FIG. 4, the extent of decrease in the reset resistance as the temperature rises may be higher than that in the set resistance. Accordingly, when the margin between the set resistance and the reset resistance is ΔM1 at ambient temperature, as illustrated in FIG. 5, the margin between the set resistance and the reset resistance decreases to ΔM2 at a temperature higher than ambient temperature.

Furthermore, since the set resistance and the reset resistance decrease as temperature rises, the pass through current Ith, which depends on the resistance of the phase change material, increases. Accordingly, when temperature rises, the level of the sensing node NS in a set state and the level of the sensing node NS in a reset state decreases, as illustrated in FIG. 6. In FIG. 6, the X-axis and the Y-axis respectively represent temperature and the voltage level of the sensing node NS. "a1" and "a2" respectively indicate the level of the sensing node NS in a reset state and the level of the sensing node NS in a set state at ambient temperature. "b1" and "b2" respectively indicate the level of the sensing node NS in a reset state and the level of the sensing node NS in a set state at a temperature higher than ambient temperature. As illustrated in FIG. 6, as temperature rises, the margin between the level of the sensing node NS in a set state and the level of the sensing node NS in a reset state decreases. Accordingly, the sense amplifier 150 may not correctly discriminate between a set state and a reset state, and therefore may generate an operation error such that the sense amplifier 150 may sense a reset state instead of a set state.

In addition, as the level of the operation voltage VPP changes, the level of the read bias current Icell provided from the read bias generation circuit 130 also changes. When the level of the read bias current Icell changes, the level of the sensing node NS also changes, and the sense amplifier 150 may not correctly discriminate between a set state and a reset state.

In addition, MOS transistors included in the read circuit 100 in FIG. 2 may have different threshold voltages due to the process variation. More particularly, as illustrated in FIG. 3, the read bias generating circuit 130 includes the PMOS transistors MP2 and MP3, and the precharge circuit 110 includes the NMOS transistors MN1 and MN2. The transistors MN1, MN2, MP2 and MP3 may have different threshold voltages due to the process variation, and therefore the level of the read bias current Icell may change due to process variation.

More particularly, multiple chips are fabricated in a single wafer and the characteristics of each chip vary depending on the position on the wafer. For example, for a chip located in a corner of the wafer, the threshold voltage of the PMOS transistor may be higher than the value and the threshold voltage of the NMOS transistor may be lower than the value. In this case, the level of the read bias current Icell, which is provided from the read bias generating circuit 130 to the phase change memory cell MC, may be higher than a level of a case when the MOS transistors have threshold values. In addition, for a chip located on another corner of the wafer, the threshold voltage of the PMOS transistors may be lower than the value and the threshold voltage of the NMOS transistor may be higher than the value. In this case, the level of the read bias current Icell, which is provided from the read bias generating circuit 130 to the phase change memory cell MC, may be higher than a level of a case when the MOS transistors have threshold values.

Figure 7:
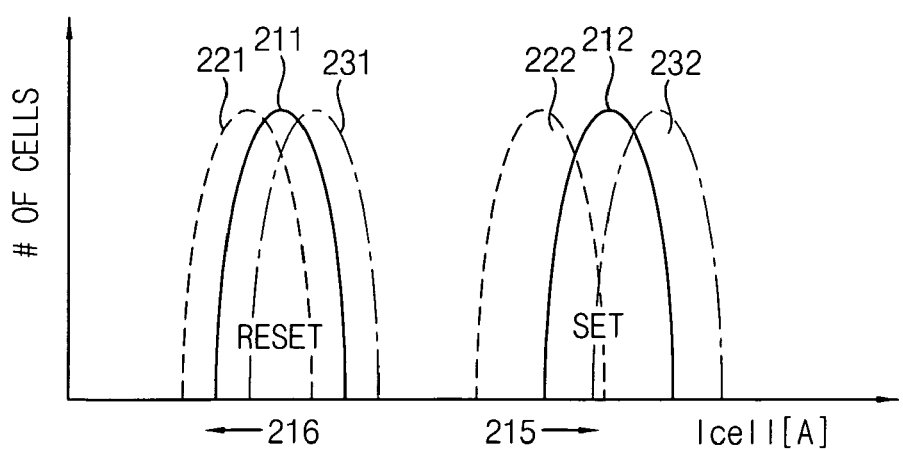
FIG. 7 illustrates set and reset current distributions of a phase change memory cell depending on various factors associated with the phase change memory cell.

FIG. 7 illustrates set and reset current distributions of a phase change memory cell depending on various factors associated with the phase change memory cell.

FIG. 7 illustrates the set and reset current distributions of a phase change memory cell depending on the process variation, the temperature, and the level of the operation voltage. In FIG. 7, the level of the clamping control signal VCMP remains constant.

In FIG. 7, reference numerals 211 and 212 respectively represent normal cases when ambient temperature does not change, the process variation does not occur, and the level of the operation voltage VPP remains constant. Reference numerals 221 and 222 respectively represent cases when ambient temperature rises, the threshold voltage of the PMOS transistor is higher than the value and the threshold voltage of the NMOS transistor is lower than the value due to the process variation, and the level of the operation voltage VPP decreases. Reference numerals 231 and 232 respectively represent cases when ambient temperature drops, the threshold voltage of the PMOS transistor is lower than the value and the threshold voltage of the NMOS transistor is higher than the value due to the process variation, and the level of the operation voltage VPP increases.

As illustrated in FIG. 7, in cases of reference numerals 221 and 222 or reference numerals 231 and 232, the margin between the level of the sensing node NS in a set state and the level of the sensing node NS in a reset state decrease compared with cases of reference numerals 211 and 212. Therefore, the sense amplifier 150 may not correctly discriminate between a set state and a reset state, and therefore may generate an operation error such that the sense amplifier 150 may sense a reset state instead of a set state.

Figure 8:
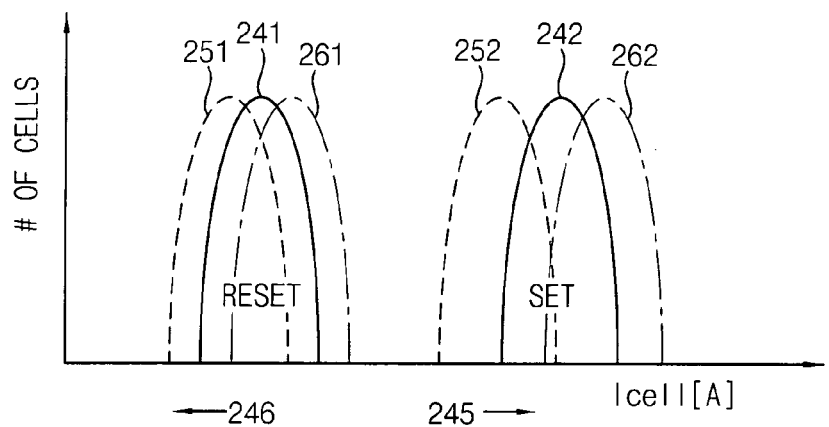
FIG. 8 illustrates the set and reset current distributions of a phase change memory cell depending on the level of the clamping control signal.

FIG. 8 illustrates the set and reset current distributions of a phase change memory cell depending on the level of the clamping control signal. In FIG. 8, the level of the read bias current Icell remains constant.

In FIG. 8, reference numerals 241 and 242 respectively represent normal cases when the level of the clamping control signal VCMP remains fixed. Reference numerals 251 and 252 respectively represent cases when the level of the clamping control signal VCMP increases. Reference numerals 261 and 262 respectively represent cases when the level of the clamping control signal VCMP decreases.

When the level of the clamping control signal VCMP increases, an amount of clamping current Ivcmp also increases. Accordingly, the level of the sensing node NS in a set state and the level of the sensing node NS in a reset state decrease because the amount of the pass through current Ith increases as described with reference to FIG. 6. In addition, when level of the clamping control signal VCMP decreases, an amount of clamping current Ivcmp also decreases. Accordingly, the level of the sensing node NS in a set state and the level of the sensing node NS in a reset state increase because the amount of the pass through current Ith decreases.

For overcoming these problems, the level of the clamping control signal VCMP is adjusted to compensate for the level change of the sensing node NS due to various factors according to example embodiments. That is, an amount of the clamping current Ivcmp is adjusted by controlling the level of the clamping control signal VCMP.

Figure 9:
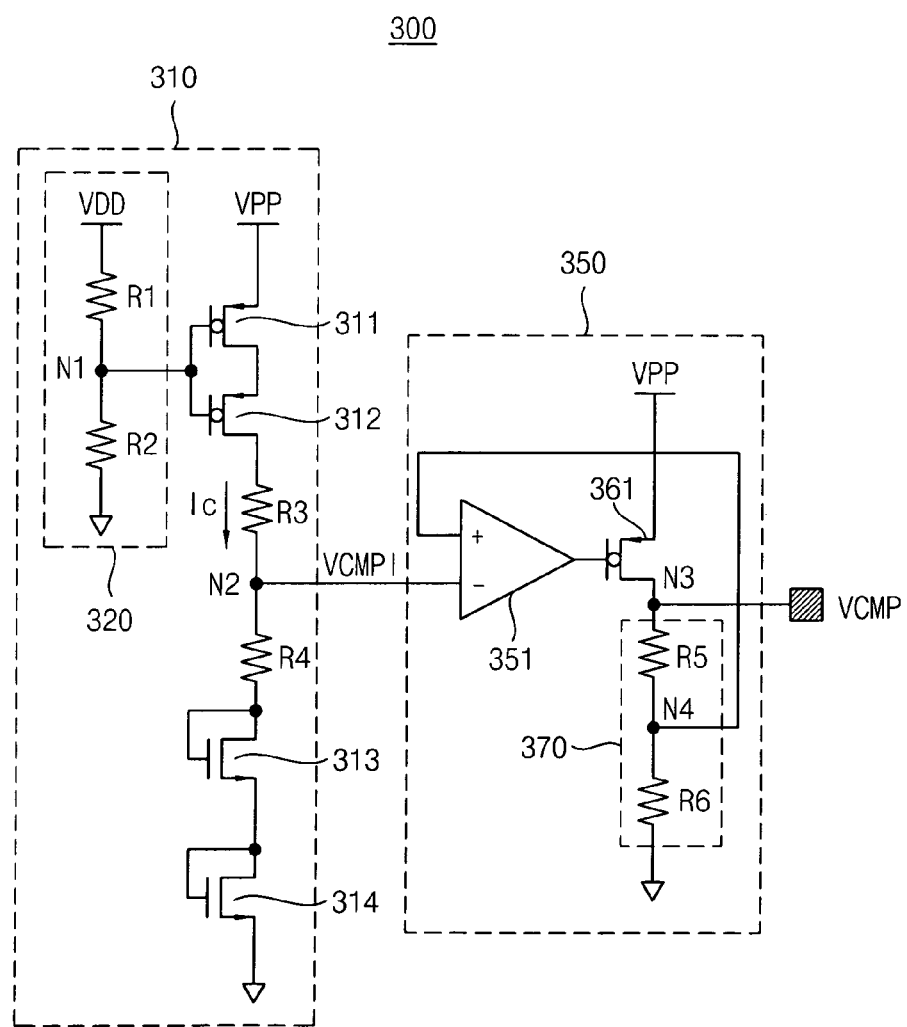
FIG. 9 illustrates a clamping control signal generating circuit according to example embodiments.

FIG. 9 is a circuit diagram illustrating a clamping control signal generating circuit according to example embodiments.

Referring to FIG. 9, a clamping control signal generating circuit (CCSGC) 300 includes a self tracking circuit 310 and a level shifter 350. The self tracking circuit 310 includes a bias voltage providing unit 320, PMOS transistors 311 and 312, resistors R3 and R4 and NMOS transistors 313 and 314. Although the CCSGC 300 is implemented with two PMOS transistors 311 and 312 and two NMOS transistors 313 and 314 in FIG. 9, the CCSGC 300 may include one PMOS transistor and one NMOS transistor according to some example embodiments.

The bias voltage providing unit 320 includes resistors R1 and R2 connected in series between the power supply voltage VDD and the ground voltage. The resistors R1 and R2 are connected to each other at a node N1, and the bias voltage providing unit 320 provides a fixed bias voltage, e.g., R2×VDD/(R1+R2), to the PMOS transistors 311 and 312, at the node N1. That is, the bias voltage providing unit 320 operates as a voltage divider. Accordingly, the PMOS transistors 311 and 312 are always in a conducting state, that is, the PMOS transistors 311 and 312 are always turned on.

The PMOS transistors 311 and 312 are connected in series between the operation voltage VPP and the resistor R3. The NMOS transistors 313 and 314 are connected in series between the resistor R4 and the ground voltage. Each of the NMOS transistors 313 and 314 is diode-connected. An intermediate clamping signal VCMPI is provided at a node N2 where the resistors R3 and R4 are connected to each other.

As described above, the self tracking circuit 310 may adjust the level of the intermediate clamping control signal VCMPI for compensating for the level change of the sensing node NS due to at least one of the various factors such as the temperature change, the process variation and the level change of the operation voltage VPP because the self tracking circuit 310 is implemented with the PMOS transistors 311 and 312, resistors R3 and R4 and the NMOS transistors 313 and 314.

The level shifter 350 includes an operational amplifier 351, PMOS transistor 361 and level adjusting unit 370. The intermediate clamping control signal VCMPI is applied to a negative (−) input terminal of the operational amplifier 351. Source of the PMOS transistor 361 is connected to the operation voltage VPP, gate of the PMOS transistor 361 is connected to an output terminal of the operational amplifier 351, and drain of the PMOS transistor 361 is connected to the level adjusting unit 370 at a node N3. In addition, the clamping control signal VCMP is provided at the node N3. The level adjusting unit 370 includes resistors R5 and R6 connected in series between the node N3 and the ground voltage. A node N4, where the resistors R5 and R6 are connected to each other, is connected to a positive (+) input terminal of the operational amplifier 351. The level shifter 350 shifts the level of the intermediate clamping control signal VCMPI to a desired level while maintaining the level compensation ratio of the intermediate clamping control signal VCMPI due to at least one of the various factors such as the temperature change, the process variation and the level change of the operation voltage VPP. Therefore, relationship between the intermediate clamping control signal VCMPI and the clamping control signal VCMP may be represented by the following equation.

[Equation]

$$VCMP = (1+R5/R6) \times VCMPI \quad (1)$$

Therefore, the level of the clamping control signal VCMP may be adjusted to have a desired level by adjusting the resistors R5 and R6.

Hereinafter, there will be detailed description of the CCSGC 300 with reference to FIGS. 7 to 9.

The PMOS transistors 311 and 312 in the self tracking circuit 310 are connected to the operation voltage VPP, and therefore, the level change of the intermediate clamping control signal VCMPI or the level change of the clamping control signal VCMP follows the level change of the operation voltage VPP. For example, when the level of the operation voltage VPP lowers, the set and reset current distributions of the phase change memory cell MC move to a direction 215 as illustrated in FIG. 7. However, when the level of the operation voltage VPP lowers, the level of the intermediate clamping control signal VCMPI also lowers and the set and reset current distributions of the phase change memory cell MC moves to a direction 246 as illustrated in FIG. 8 such that the level change of the sensing node NS may be compensated for according to example embodiments. For example, when the level of the operation voltage VPP rises, the set and reset current distributions of the phase change memory cell MC move to a direction 216 as illustrated in FIG. 7. However, when the level of the operation voltage VPP rises, the level of the intermediate clamping control signal VCMPI also rises and the set and reset current distributions of the phase change memory cell MC move to a direction 245 as illustrated in FIG. 8 such that the level change of the sensing node NS may be compensated for according to example embodiments.

For example, when the threshold voltage of the PMOS transistor is higher than the value or the threshold voltage of the NMOS transistor is lower than the value due to the process variation, the set and reset current distributions of the phase change memory cell MC move to a direction 215 as illustrated in FIG. 7. However, when the threshold voltage of the PMOS transistor is higher than the value or the threshold voltage of the NMOS transistor is lower than the value due to the process variation, amount of current Ic flowing to the node N2 decreases and therefore the level of the intermediate clamping control signal VCMPI lowers. Therefore, the set and reset current distributions of the phase change memory cell MC moves to a direction 246 as illustrated in FIG. 8 such that the level change of the sensing node NS may be compensated for according to example embodiments. For example, when the threshold voltage of the PMOS transistor is higher than the value or the threshold voltage of the NMOS transistor is lower than the value due to the process variation, the set and reset current distributions of the phase change memory cell MC move to a direction 215 as illustrated in FIG. 7. However, when the threshold voltage of the PMOS transistor is lower than the value or the threshold voltage of the NMOS transistor is higher than the value due to the process variation, amount of current Ic flowing to the node N2 increases and therefore the level of the intermediate clamping control signal VCMPI rises. Therefore, the set and reset current distributions of the phase change memory cell MC moves to a direction 246 as illustrated in FIG. 8 such that the level change of the sensing node NS may be compensated for according to example embodiments.

When ambient temperature rises, the set and reset current distributions of the phase change memory cell MC move to a direction 216 as illustrated in FIG. 7. However, when ambient temperature rises, amount of current Ic flowing to the node N2 decreases because resistances of the resistors R3 and R4 increase. Therefore, the level of the intermediate clamping control signal VCMPI also lowers and the set and reset current distributions of the phase change memory cell MC moves to a direction 245 as illustrated in FIG. 8 such that the level change of the sensing node NS may be compensated for according to example embodiments. When ambient temperature drops, the set and reset current distributions of the phase change memory cell MC move to a direction 215 as illustrated in FIG. 7. However, when ambient temperature rises, amount of current Ic flowing to the node N2 increases because resistances of the resistors R3 and R4 decrease. Therefore, the level of the intermediate clamping control signal VCMPI also rises and the set and reset current distributions of the phase change memory cell MC moves to a direction 246 as illustrated in FIG. 8 such that the level change of the sensing node NS may be compensated for according to example embodiments.

Figure 10A:
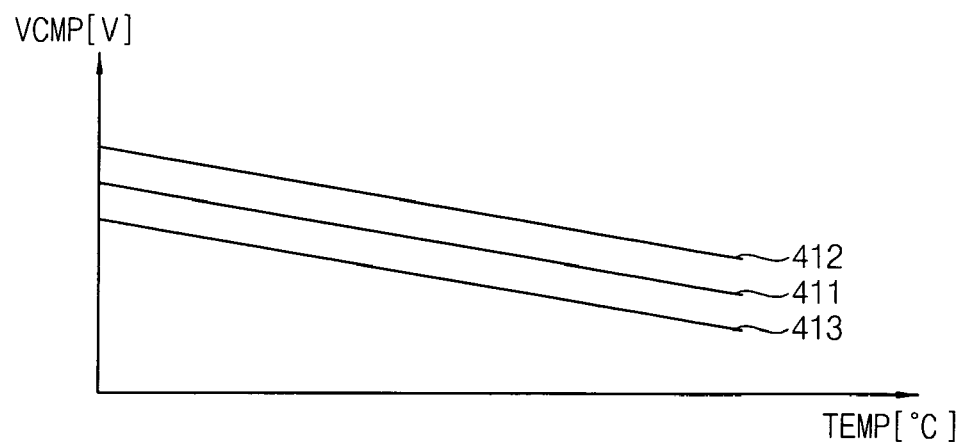
FIGS. 10A to 10C illustrates the level of the clamping control signal depending on various factors according to example embodiments.
Figure 10B:
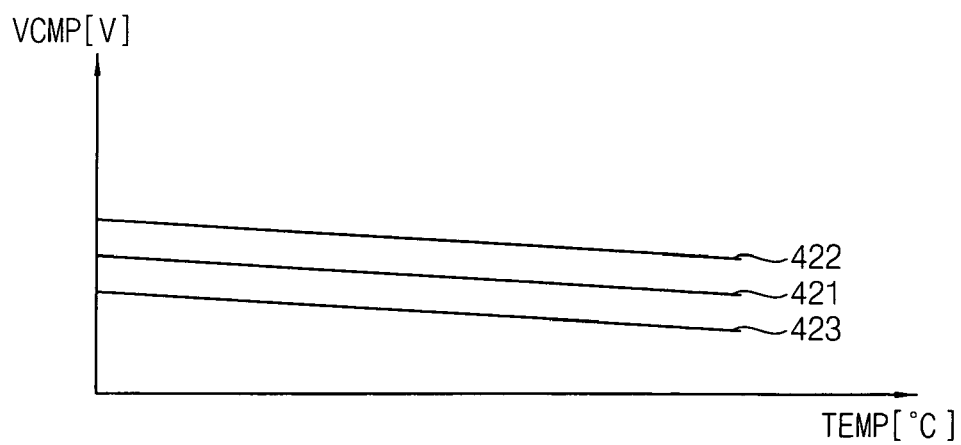
Figure 10C:
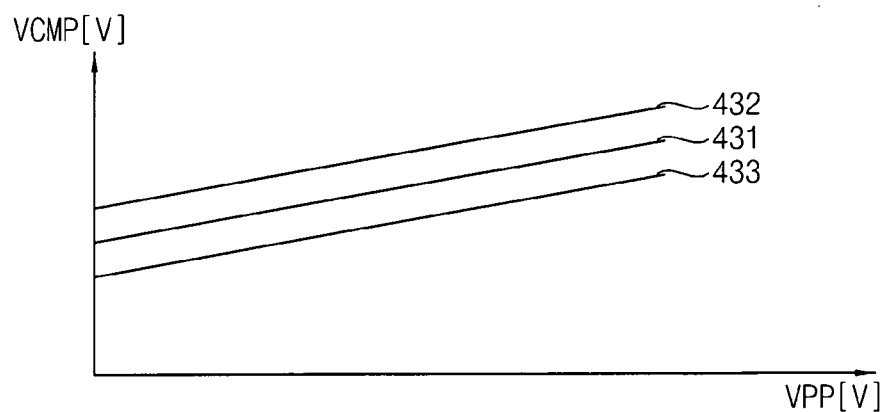

FIGS. 10A to 10C illustrate the level of the clamping control signal depending on various factors according to example embodiments.

FIG. 10A illustrates the level of the clamping control signal VCMP depending on the threshold voltage of NMOS transistor due to ambient temperature and the process variation.

In FIG. 10A, reference numeral 411 represents a typical threshold voltage of NMOS transistor, reference numeral 412 represents a case when threshold voltage of NMOS transistor is higher than the value, and reference numeral 413 represents a case when threshold voltage of NMOS transistor is lower than the value. As is noted from FIG. 10A, the level of the clamping control signal VCMP inversely follows the threshold voltage of NMOS transistor. That is, the level change of the clamping control signal VCMP is inversely proportional to the change of the threshold voltage of NMOS transistor.

FIG. 10B illustrates the level of the clamping control signal VCMP depending on the threshold voltage of PMOS transistor due to ambient temperature and the process variation.

In FIG. 10B, reference numeral 421 represents a typical threshold voltage of PMOS transistor, reference numeral 422 represents a case when threshold voltage of PMOS transistor is lower than the value, and reference numeral 423 represents a case when threshold voltage of PMOS transistor is higher than the value. As is noted from FIG. 10B, the level of the clamping control signal VCMP follows the threshold voltage of PMOS transistor. That is, the level change of the clamping control signal VCMP is proportional to the change of the threshold voltage of PMOS transistor.

FIG. 10C illustrates the level of the clamping control signal VCMP depending on the operation voltage VPP and ambient temperature. In FIG. 10C, reference numeral 431 represents a case when ambient temperature is normal, i.e., room temperature, reference numeral 432 represents a case when ambient temperature is higher than room temperature, and reference numeral 433 represents a case when ambient temperature is higher than room temperature. As is noted from FIG. 10C, the level of the clamping control signal VCMP follows ambient temperature and the operation voltage VPP. That is, the level change of the clamping control signal VCMP is proportional to the change of ambient temperature and the level change of the operation voltage VPP.

Figure 11A:
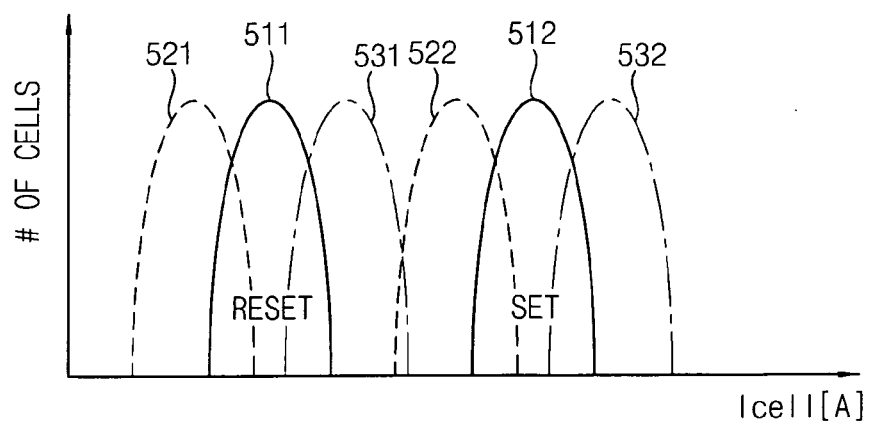
FIGS. 11A and 11B are diagrams for explaining effect of example embodiments.
Figure 11B:
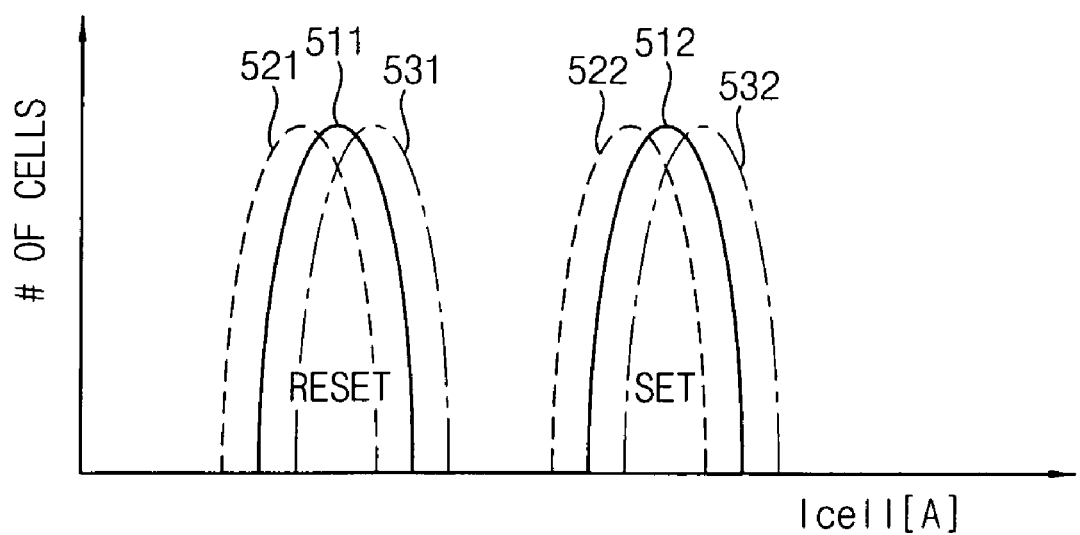

FIGS. 11A and 11B are diagrams for explaining effect of example embodiments.

FIG. 11A illustrates set and reset current distributions of the phase change memory cell MC when the level of the clamping control signal VCMP is fixed.

FIG. 11B illustrates set and reset current distributions of the phase change memory cell MC when the level of the clamping control signal VCMP is adjusted according to change of the various factors according to example embodiments.

In FIGS. 11A and 11B, reference numerals 511 and 512 represent the set and reset current distributions of the phase change memory cell MC before at least one of the various factors changes. Reference numerals 521 and 522 represent the set and reset current distributions of the phase change memory cell MC when ambient current rises, the threshold voltage of PMOS transistor is higher than the value, the threshold voltage of NMOS transistor is lower than the value and/or the level of the operation voltage VPP lowers. Reference numerals 531 and 532 represent the set and reset current distributions of the phase change memory cell MC when ambient current drops, the threshold voltage of PMOS transistor is higher than the value, the threshold voltage of NMOS transistor is lower than the value and/or the level of the operation voltage VPP lowers.

When the level of the clamping control signal VCMP is fixed while at least one of various factors such as ambient temperature, the process variation and the operation voltage VPP changes, the margin between the set and reset current distributions of the phase change memory cell MC is very narrow as illustrated in FIG. 11A such that read operation may not be correctly performed. However, when level of the clamping control signal VCMP is compensated for the level change of the sensing node NS while at least one of various factors such as ambient temperature, the process variation and the operation voltage VPP changes, margin between the set and reset current distributions of the phase change memory cell MC may be wide enough for performing correct read operation as illustrated in FIG. 11B.

As mentioned above, the phase change memory device according to example embodiments is capable of compensating for change of sensing margin such that credibility of read operation of the phase change memory device is secured. Therefore, the phase change memory device according to example embodiments may be employed in a phase change memory device and a memory system requiring large capacity, and cause an increase in yield.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of inventive concepts. Accordingly, all such modifications are intended to be included within the scope of inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A phase change memory device, comprising:
   a memory cell array having a plurality of phase change memory cells;
   a read bias generating circuit configured to output a read bias current;
   a clamping circuit configured to control an amount of clamping current into a bit line connected with a selected phase change memory cell, in response to a clamping control signal; and
   a clamping control signal generating circuit (CCSGC), configured to adjust the clamping control signal based on at least one of a change of ambient temperature of the phase change memory device, a process variation in fabrication of the phase change memory device and a change of an operation voltage.

2. The phase change memory device of claim 1, wherein the CCSGC comprises:
- a self tracking circuit configured to receive an operation voltage and generate an intermediate clamping control signal based on a voltage of a sensing node, the sensing node receiving the read bias current; and
- a level shifter configured to shift the intermediate clamping control signal to output the clamping control signal.

3. The phase change memory device of claim 2, wherein the self tracking circuit comprises:
- first and second p-type metal oxide semiconductor (PMOS) transistors configured to receive a bias voltage, the first PMOS transistor being configured to receive the operation voltage, and the second PMOS transistor being connected in series to the first PMOS transistor;
- first and second resistors, the first resistor being connected to the second PMOS transistor, and the second resistor being connected in series to the first resistor;
- first and second n-type MOS (NMOS) transistors, the first NMOS transistor being connected to the second resistor, and the second NMOS transistor being connected in series to the first NMOS transistor; and
- a bias voltage providing unit configured to output the bias voltage.

4. The phase change memory device of claim 3, wherein the third and fourth resistors are connected at a first node, the bias voltage providing unit includes third and fourth resistors connected in series between a power supply voltage and a ground voltage, and the bias voltage is output at the first node.

5. The phase change memory device of claim 4, wherein the first and second PMOS transistors are in configured to be in a conducting state in response to the bias voltage.

6. The phase change memory device of claim 3, wherein the first and second resistors are connected at a second node, the intermediate clamping control signal is output at the second node, and each of the first and second NMOS transistors is diode-connected.

7. The phase change memory device of claim 6, wherein the level shifter comprises:
- an operational amplifier having a first input terminal configured to receive the intermediate clamping control signal;
- a third PMOS transistor having a source configured to receive the operation voltage, a gate connected to an output terminal of the operational amplifier, and a drain, the clamping control signal being output at the drain; and
- a level adjusting unit connected to the drain of the third PMOS transistor at a third node, the level adjusting unit being configured to adjust the clamping control signal.

8. The phase change memory device of claim 7, wherein the level adjusting unit comprises:
- a fifth resistor connected to the third node; and
- a sixth resistor connected in series to the fifth resistor at a fourth node, wherein the fourth node is connected to a second input terminal of the operational amplifier.

9. The phase change memory device of claim 8, wherein the clamping control signal and the intermediate clamping control signal have a relationship as follows:

$$VCMP=(1+R5/R6)\times VCMPI,$$

where VCMP is the clamping control signal, VCMPI is the intermediate clamping control signal, R5 is the fifth resistor, and R6 is the sixth resistor.

10. The phase change memory device of claim 2, wherein the CCSGC is configured to adjust the clamping control signal based on the operation voltage.

11. The phase change memory device of claim 2, wherein the CCSGC is configured to adjust the clamping control signal based on a level that is inversely proportional to a change of ambient temperature.

12. The phase change memory device of claim 2, wherein the CCSGC is configured to adjust the clamping control signal based on a level that is inversely proportional to a change of a threshold voltage of an NMOS transistor included in the CCSGC.

13. The phase change memory device of claim 2, wherein the CCSGC is configured to adjust the clamping control signal based on a level that is proportional to a change of a threshold voltage of a PMOS transistor included in the CCSGC.

14. A memory system comprising:
- a phase change memory device having a plurality of phase change memory cells configured to store data; and
- a memory controller configured to control the phase change memory device, the phase change memory device including,
- a read bias generating circuit configured to output a read bias current;
- a clamping circuit configured to control an amount of clamping current into a bit line connected with a selected phase change memory cell, in response to a clamping control signal; and
- a clamping control signal generating circuit (CCSGC), configured to adjust the clamping control signal based on at least one of a change of ambient temperature of the phase change memory device, a process variation in fabrication of the phase change memory device and a change of an operation voltage.

15. The memory system of claim 14, wherein the CCSGC is configured to adjust the clamping control signal based on at least one of (1) the operation voltage,(2) a level that is inversely proportional to the change of ambient temperature, (3) a level that is inversely proportional to a change of a threshold voltage of a NMOS transistor, or (4) a level that is proportional to a change of a threshold voltage of a PMOS transistor, wherein the NMOS and PMOS transistors are included in the CCSGC.

* * * * *